(12) United States Patent
Kahl et al.

(10) Patent No.: US 12,739,970 B2
(45) Date of Patent: Sep. 15, 2026

(54) ILLUMINATED SIGNAGE AND BADGES

(71) Applicant: CoreLED Systems, LLC, Livonia, MI (US)

(72) Inventors: John Kahl, Troy, MI (US); Nadia Zelikovskaya, Plymouth, MI (US); Derek Mallory, Northville, MI (US); Brian C. Wells, Grosse Pointe Farms, MI (US)

(73) Assignee: CoreLED Systems, LLC, Livonia, MI (US)

( * ) Notice: Subject to any disclaimer, the term of this patent is extended or adjusted under 35 U.S.C. 154(b) by 544 days.

(21) Appl. No.: 18/225,340

(22) Filed: Jul. 24, 2023

(65) Prior Publication Data

US 2025/0040040 A1 Jan. 30, 2025

(51) Int. Cl.

| | |
|---|---|
| ***H05K 1/02*** | (2006.01) |
| ***G02B 1/04*** | (2006.01) |
| ***G02B 3/06*** | (2006.01) |
| ***H05K 1/181*** | (2026.01) |

(52) U.S. Cl.

CPC ........... *H05K 1/0274* (2013.01); *G02B 1/041* (2013.01); *G02B 3/06* (2013.01); *H05K 1/181* (2013.01); *H05K 2201/10106* (2013.01); *H05K 2201/10128* (2013.01); *H05K 2201/10984* (2013.01); *H05K 2201/2054* (2013.01)

(58) Field of Classification Search

CPC ................. H05K 1/0274; H05K 1/181; H05K 2201/10106; G02B 1/041; G02B 3/06

See application file for complete search history.

(56) References Cited

U.S. PATENT DOCUMENTS

2011/0149599 A1 6/2011 Wei et al.
2012/0069575 A1* 3/2012 Koh ..................... G02B 6/0046 362/257
2020/0096178 A1* 3/2020 Aviram ................... F21V 17/08

FOREIGN PATENT DOCUMENTS

CN 213746587 U * 7/2021 ......... G02B 19/0071
EP 2103972 9/2009

OTHER PUBLICATIONS

CN-213746587-U Translation (Year: 2020).*

* cited by examiner

*Primary Examiner* — Nathan Milakovich

(74) *Attorney, Agent, or Firm* — Gunther J. Evanina; BUTZEL LONG

(57) ABSTRACT

An illuminated sign includes a printed circuit board a plurality of light emitting diodes mounted on the printed circuit board; a reflective layer disposed over the printed circuit board, the reflective layer being patterned to expose the light emitting diodes and a predetermined area around each of the light emitting diodes; an optionally transmissive lightguide layer disposed over the reflective layer; and a patterned light mask disposed over the clear lightguide layer, the light mask having opaque portions and transparent or translucent portions, wherein transparent or translucent portions of the light mask overlay the reflective layer and opaque portions of the light mask overlay the light emitting diodes.

20 Claims, 3 Drawing Sheets

ILLUMINATED SIGNAGE AND BADGES

FIELD OF THE DISCLOSURE

This disclosure relates to signage and badges that are illuminated with light emitting diodes, and more particularly to such illuminated signage and badges that exhibit uniform brightness.

BACKGROUND OF THE DISCLOSURE

Illuminated signage employing light emitting diodes (LEDs) generally either have the LEDs located behind light transmissive (transparent or translucent) portions of a light mask, or employ LEDs at edges along the perimeter of the sign. In the first (back-lighting) arrangement, the LEDs create visual hot spots (i.e., areas of high light intensity surround by lower light intensity areas). In the second (perimeter lighting) arrangement, there is a more gradual, but still perceptible and aesthetically displeasing fading of light intensity from the edges inwardly.

Accordingly, there remains a need for illuminated signs and badges that provide uniform illumination of lettering and/or other indicia through a light mask.

SUMMARY OF THE DISCLOSURE

Disclosed are signs or badges having a thin profile, high luminescence, and uniform luminescence. The signs include a printed circuit board; one or a plurality of light emitting diodes mounted on the printed circuit board; a reflective layer disposed over the printed circuit board, the reflective layer being patterned to expose the light emitting diodes and a predetermined area around each of the light diodes; an optically transmissive lightguide layer disposed over the reflective layer, a patterned light mask disposed over the lightguide layer, the light mask having opaque portions and transparent or translucent portions, wherein transparent or translucent portions of the light mask overlay the reflective layer and opaque portions of the light mask overlay the light emitting diodes.

In certain aspects the lightguide layer has an upper surface defining an inverted conical recess overlying one of each of the plurality of light emitting diodes and a lower surface defining a recess in which an associated one of each of the plurality of light emitting diodes is located, whereby light emitted from each of the plurality of light emitting diodes can be internally reflected at an optic-to-air interface of the associated inverted conical recess, and directed outwardly from the inverted conical recess and generally laterally through the lightguide layer.

In certain other aspects, a side-emitting surface-mountable optic overlies one of each of the plurality of light emitting diode; each side-emitting surface-mountable optic including a base solder-mounted to the printed circuit board and an optically transmissive lens attached to the base, the transparent lens having a generally cylindrical shape, including a generally circular perimeter wall, an inverted conical recess at a top of the lens, and a recess at a bottom of the lens overlying an opening in the base; and wherein the perimeter wall of each of the side-emitting surface-mountable optics interfaces with the lightguide layer, whereby light from underlying upwardly emitting light emitting diode can be internally reflected at an optic-to-air interface of the inverted conical recess, and directed outwardly from the generally circular perimeter wall and into and through the lightguide layer.

In accordance with another aspect of the disclosure, a side-emitting surface-mountable optic device includes a solder-mountable base; an optically transmissive lens attached to the base having a generally cylindrical shape, including a generally circular perimeter wall, an inverted conical recess at a top of the lens, and a recess at a bottom of the lens overlying an opening in the base, whereby light from an underlying upwardly emitting light emitting diode can be internally reflected, at an optic-to-air interface of the inverted conical recess and directed outwardly from the generally circular perimeter wall.

Also disclosed is a backlit display having a printed circuit board having conductive traces, a plurality of light emitting diodes on the printed circuit board that are capable of being powered via the conductive traces; a lens positioned over an associated one of each of the plurality of light emitting diodes, the lens having a continuously curved side wall, a recess at a bottom of the lens in which the associated light emitted diode is located, and an inverted conical recess at a top of the lens for redirecting light propagating upwardly from the light emitting diode into the bottom of the lens outwardly through the curved side wall; a reflector layer disposed over areas of the printed circuit board; a transparent lightguide layer disposed over the reflector layer and having surfaces interfacing the side wall of the lens, whereby light from the side wall is propagated and dispersed through the lightguide layer; and a patterned light mask having opaque portions disposed over the lenses and associated light emitting diodes, and transparent or translucent portions disposed over the reflector layer.

DETAILED DESCRIPTION

The words top, bottom, overlie, underlie and similar language is made in reference to the drawings, it being understood that the described signs and badges can be oriented in generally any direction. While most signage applications will include a plurality of LED's, the claims and this disclosure also encompass devices having a single LED, such as an illuminated push or touch button.

Figure 1:
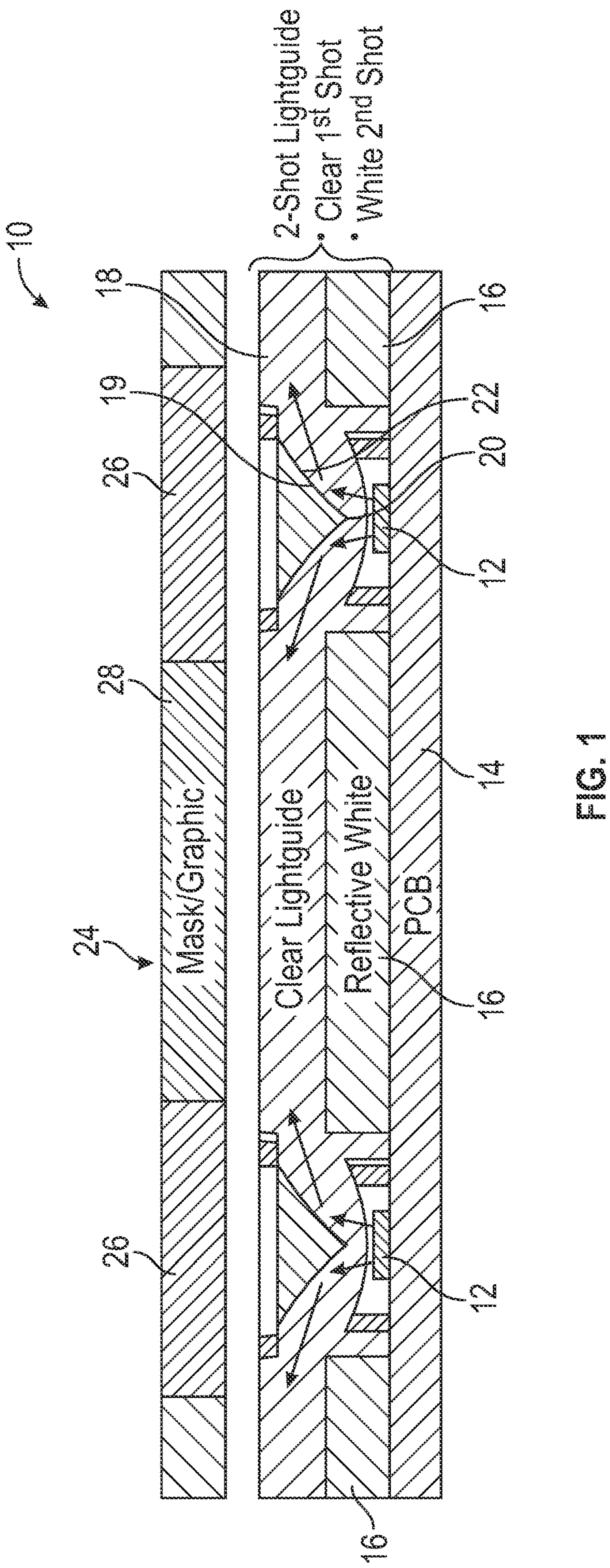
FIG. 1 is a cross-sectional schematic of a sign in accordance with this disclosure

A back-lighted sign or badge 10 in accordance with an aspect of this disclosure is schematically illustrated in cross-section in FIG. 1. The illustrated embodiment shows only two LEDs 12. However, it will be appreciated that any number of LEDs can be arranged on printed circuit board (PCB) 14, with conductive traces on the PCB electrically connecting the LEDs with an appropriate power source.

Deposited on or positioned over PCB 14 is a layer of reflective material 16 except in the immediate vicinity of LEDs 12. Reflective layer 16 can be a thermoplastic material such as a polycarbonate or polymethyl methacrylate. Reflective layer 16 can be pigmented to enhance reflectivity and to reduce light absorption. Layer 16 can be pigmented white to provide opacity and high reflectivity. Layer 16 can be from about 0.1 mm to about 6 mm thick.

Deposited on or positioned over reflective layer 16 and over, but preferably not on, LEDs 12 is a layer of optically transmissive (i.e., transparent or translucent) material layer 18 that serves as a lightguide. Optically transmissive materials include transparent or clear materials that allow light to pass through without appreciable scattering of light, and translucent materials that allow light to pass through with some scattering, usually attributable to the presence of different materials having different indices of refraction. The optically transmissive lightguide layer can be a thermoplastic material such as a polycarbonate or polymethyl methacrylate. Layer 18 can be from about 0.1 mm to about 6 mm thick.

Optically transmissive lightguide layer 18 is formed with an inverted conical recess 19 at its upper surface, that overlies each of the LEDs 12. For purposes of this disclosure the term "conical recess" shall be interpreted to include a recess that tapers from the upper surface of layer 18 to a point 20 near a lower surface of layer 18, with the recess having a generally circular horizontal cross-section. Recess 19 is configured to provide an optic-to-air interface 22 that causes light emitted upwardly from LED 12 to be internally reflected laterally (approximately 90° angle from vertical) through lightguide layer 18. A lower region of lightguide layer 18 overlying LEDs 12 can be spaced away from LEDs 12 and can have a smooth convex surface that deflects light from the LEDs toward optic-to-air interface 22.

A light mask or graphic pattern 24 includes opaque regions 26 that overlie optic-to-air interfaces 22 (or inverted recesses 19) and LEDs 12, and clear or translucent regions 28 that overlie reflective layer 16. In preferred embodiments, all LEDs 12 are covered by opaque portions 26 of mask 24, and none of the transparent or translucent portions 28 of mask 24 overlie LEDs 12.

Reflective layer 16 and lightguide layer 18 are preferably made by an injection molding process. Layer 16 and layer 18 can be molded individually, or, more preferably, are molded together in a two-shot molding process in which the interfacing surfaces of layers 16 and 18 are molecularly bonded together or fused together by the molding process.

Figures 2, 3:
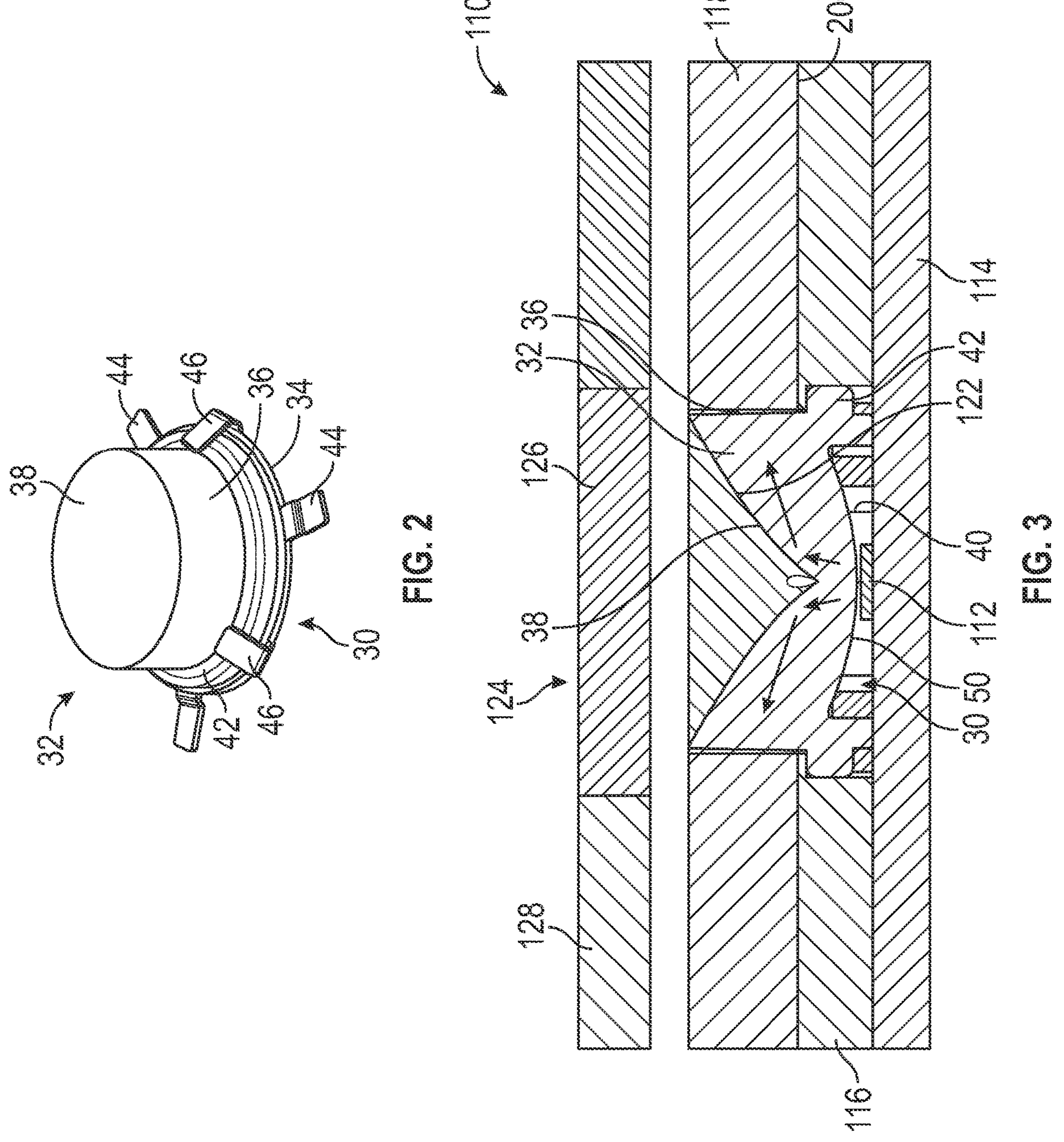
FIG. 2 is a perspective view of a side-emitting surface-mountable optic device.
FIG. 3 is a cross-sectional schematic of a sign using the optic device shown in FIG. 2.

Shown in FIG. 2 is a 360-degree side-emitting surface-mountable optic 30 that can be used in an alternative embodiment to the sign or badge 10 shown in FIG. 3. Surface-mountable 30 includes a lens 32 attached to a base 34. Lens 32 is made of a light transmissive material (transparent or translucent), such as a thermoplastic material (e.g., silicone, polycarbonate, polymethyl methacrylate). Lens 32 has a generally cylindrical shape, including a generally circular perimeter wall 36 an inverted conical recess 38 at a top of lens 32 and a bottom recess 40 (FIG. 3) that overlies an opening in base 34. Lens 32 can include a bottom rim or flange 42 that protrudes laterally (sideways) away from a bottom portion of perimeter wall 36. Base 34 can include a plurality of outwardly projecting tabs 44 to facilitate soldering of optic 30 to PCB 114. Base 34 can also include a plurality of tabs 46 that engage flange 42 to secure lens 32 to base 34. A bottom surface 48 of lens 32 can have a convex surface 50 that can face or overlie an LED 112, as shown in FIG. 3.

Except for the use of optic elements 30, sign or badge 110 is similar to sign or badge 10. Sign/badge 110 includes a PCB 114 on which LEDs 112 are mounted (only one is shown in FIG. 3, it being understood that sign/badge 110 would typically include a plurality of LEDs 112). Sign/badge 110 also includes reflective layer 116 (similar to reflector layer 16), and light transmissive layer 118 (similar to layer 16 of sign/badge 10). Additionally, mask 124 includes opaque portions or regions 126 overlying LEDs 112 and transparent regions or portions overlying reflector layer 116 (similar to sign/badge 10).

As with sign/badge 10, layers 116 and 118 can be made in separate injection molding process and subsequently assembled together as shown in FIG. 3, or layers 116 and 118 can be made together in a two-shot molding process, wherein layers 116 and 118 are integrally joined together at an interface 200, such that the layers are fused together or molecularly bonded together. Also, as with sign/badge 10, light from LED 112 is directed upwardly toward surface 50 and directed outwardly from sidewall 36 by the lens/air interface 38 via internal reflector.

Back-lighted assemblies 10 and 110 can be used as signs (e.g., business signs) or as badges (e.g., automotive brand badges for vehicles) or other static displays.

Figure 4:
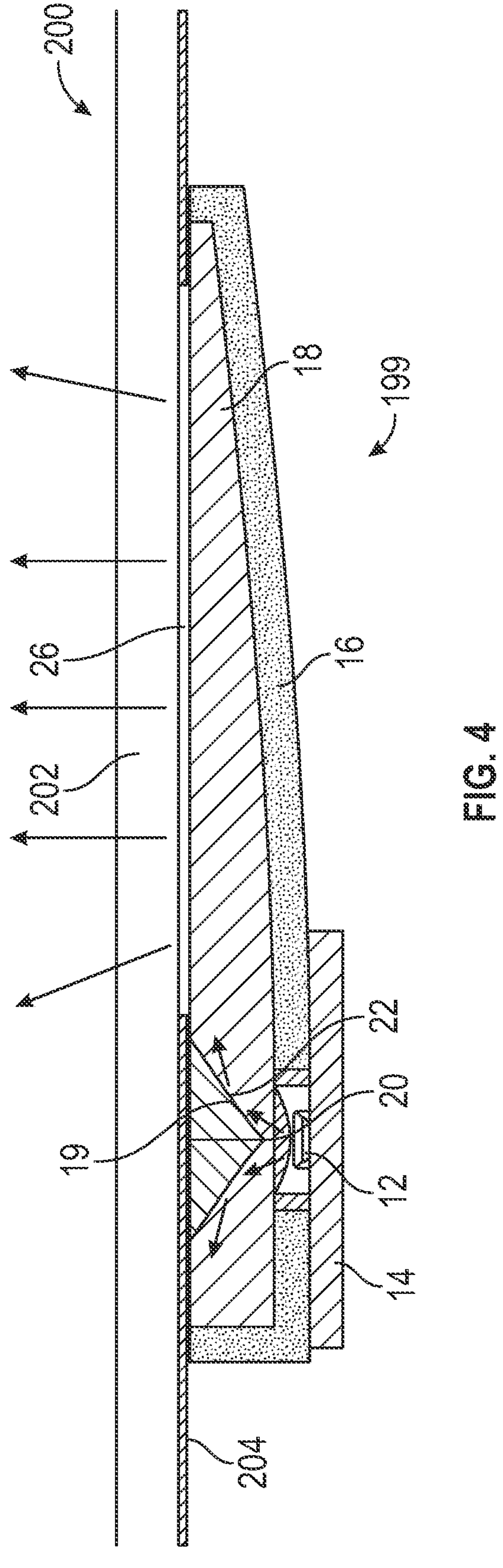
FIG. 4 is a cross-sectional schematic of an embodiment similar to that of FIG. 1 in which a mirror serves as a patterned light mask.

Shown in FIG. 4 is a device 199 similar to the sign shown in FIG. 1, in which the mask 200 is a mirror including a glass or other transparent layer 202 having opaque portions 204 such as mirror silver plating. The transparent portions 26 are at areas of layer 202 that are not provided with a mirror silver or other opaque plating or coating. Other reference numbers identify components generally as described with reference to FIG. 1. As shown in FIG. 4, reflective layer 16 may extend laterally beyond the edges of printed circuit board 14 in any of the disclosed embodiments.

While the present invention is described herein with reference to illustrated embodiments, it should be understood that the invention is not limited hereto. Those having ordinary skill in the art and access to the teachings herein will recognize additional modifications and embodiments within the scope thereof. Therefore, the present invention is limited only by the claims attached herein.

The invention claimed is:

1. An illuminated device, comprising:

a printed circuit board;

one or a plurality of light emitting diodes mounted on the printed circuit board;

a lens positioned over an associated one of each of the plurality of light emitting diodes, the lens having a continuously curved side wall, a recess at a bottom of the lens in which the associated light emitted diode is located, and an inverted conical recess at a top of the lens redirecting light propagating upwardly from the light emitting diode into the bottom of the lens outwardly through the curved side wall;

a reflective layer disposed over the printed circuit board, the reflective layer being patterned to expose the light emitting diode(s);

an optically transmissive lightguide layer disposed over the reflective layer; and a patterned light mask disposed over the optically transmissive lightguide layer, the patterned light mask having opaque portions and transparent or translucent portions, wherein transparent or translucent portions of the light mask overlay the reflective layer and opaque portions of the patterned light mask overlay the light emitting diode(s).

2. The device of claim 1, wherein the lightguide layer and the reflective layer are integrated, at an interface between the lightguide layer and the reflective layer, in a two-shot injection molding process.

3. The device of claim 1, wherein the lightguide layer and the reflective layer are molecularly bonded or fused together at an interface between the lightguide layer and the reflective layer.

4. The device of claim 1, wherein the lightguide layer has an upper surface defining an inverted conical recess overlying one of each of the plurality of light emitting diodes and a lower surface defining a recess in which an associated one of each of the plurality of light emitting diodes is located, whereby light emitted from each of the plurality of light emitting diodes can be internally reflected at an optic-to-air interface of the associated inverted conical recess, and directed outwardly from the inverted conical recess and generally laterally through the lightguide layer.

5. The device of claim 4, wherein the lower recess has a convex surface facing and overlying an associated light emitting diode.

6. The device of claim 1, wherein the reflective layer is from 0.1 mm to 6 mm thick.

7. The device of claim 1, wherein the lightguide layer is from 0.1 mm to 6 mm thick.

8. The device of claim 1, wherein the reflective layer and the lightguide layer are comprised of polycarbonate.

9. The device of claim 1, wherein the reflective layer and the lightguide layer are comprised of polymethyl methacrylate.

10. The device of claim 1, wherein each lens is a side-emitting surface-mountable optic including a base solder-mounted to the printed circuit board and an optically transmissive lens attached to the base, the lens having a generally cylindrical shape, including a generally circular perimeter wall, an inverted conical recess at a top of the lens, and a recess at a bottom of the lens overlying an opening in the base; and wherein the perimeter wall of each of the side-emitting surface-mountable optics interfaces with the lightguide layer, whereby light from underlying upwardly emitting light emitting diode can be internally reflected at an optic-to-air interface of the inverted conical recess, and directed outwardly from the generally circular perimeter wall and into and through the lightguide layer.

11. The device of claim 10, wherein the lens is comprised of silicone.

12. The device of claim 10, wherein the lens includes a bottom flange, and the base is comprised of a metal plate having a plurality of tabs engaging the flange to attach the lens to the base.

13. The device of claim 12, wherein the base further comprises a plurality of outwardly projecting tabs soldered to the printed circuit board.

14. The device of claim 10, wherein the recess at the bottom of the lens has a convex surface facing and overlying an associated light emitting diode.

15. The device of claim 1, wherein the patterned light mask is a mirror having a transparent layer that is partially coated with a mirror plating to define the opaque portions.

16. A 360-degree side-emitting surface-mountable optic, comprising:

A solder-mountable base having outwardly projecting tabs to facilitate soldering to a printed circuit board;

an optically transmissive lens attached to the base having a generally cylindrical shape, including a generally circular perimeter wall, an inverted conical recess at a top of the lens, and a recess at a bottom of the lens overlying an opening in the base, whereby light from an underlying upwardly emitting light emitting diode can be internally reflected, at an optic-to-air interface of the inverted conical recess, and directed outwardly from the generally circular perimeter wall.

17. The optic of claim 16, wherein the lens is comprised of silicone.

18. The optic of claim 16, wherein the lens includes a bottom flange, and the base is comprised of a metal plate having a plurality of tabs engaging the flange to attach the lens to the base.

19. The optic of claim 16, wherein the recess at the bottom of the lens has a convex surface facing and overlying an associated light emitting diode.

20. A backlit display, comprising:

a printed circuit board having conductive traces, one or a plurality of light emitting diodes on the printed circuit board that are capable of being powered via the conductive traces;

a lens positioned over an associated one of each of the plurality of light emitting diodes, the lens having a continuously curved side wall, a recess at a bottom of the lens in which the associated light emitted diode is located, and an inverted conical recess at a top of the lens redirecting light propagating upwardly from the light emitting diode into the bottom of the lens outwardly through the curved side wall;

a reflector layer disposed over areas of the printed circuit board;

a transparent lightguide layer disposed over the reflector layer and having surfaces interfacing the side wall of the lens, whereby light from the sidewall is propagated and dispersed through the lightguide layer; and a patterned light mask having opaque portions disposed over the lenses and associated light emitting diodes, and transparent or translucent portions disposed over the reflector layer.

* * * * *